(12) United States Patent
Snowdon

(10) Patent No.: US 10,491,722 B2
(45) Date of Patent: Nov. 26, 2019

(54) SYSTEM AND A METHOD FOR A LINE ENCODED DATA STREAM

(71) Applicant: METAMAKO GENERAL PTY LTD IN ITS CAPACITY AS GENERAL PARTNER OF METAMAKO TECHNOLOGY LP, Sydney NSW (AU)

(72) Inventor: David Charles Ambler Snowdon, Darlinghurst NSW (AU)

(73) Assignee: METAMAKO GENERAL PTY LTD IN ITS CAPACITY AS GENERAL PARTNER OF METAMAKO TECHNOLOGY LP, Sydney (AU)

( * ) Notice: Subject to any disclaimer, the term of this patent is extended or adjusted under 35 U.S.C. 154(b) by 0 days.

(21) Appl. No.: 15/752,190

(22) PCT Filed: Aug. 12, 2016

(86) PCT No.: PCT/AU2016/050750
§ 371 (c)(1),
(2) Date: Feb. 12, 2018

(87) PCT Pub. No.: WO2017/024361
PCT Pub. Date: Feb. 16, 2017

(65) Prior Publication Data
US 2018/0234527 A1    Aug. 16, 2018

(30) Foreign Application Priority Data

Aug. 12, 2015    (AU) ................................. 2015903229

(51) Int. Cl.
*H04L 29/08*    (2006.01)
*H04L 1/24*    (2006.01)
(Continued)

(52) U.S. Cl.
CPC ............ *H04L 69/324* (2013.01); *H03M 5/02* (2013.01); *H03M 5/12* (2013.01); *H04L 1/24* (2013.01);
(Continued)

(58) Field of Classification Search
CPC ........................................................ H04L 1/24
See application file for complete search history.

(56) References Cited

U.S. PATENT DOCUMENTS

| 4,520,480 A | 5/1985 | Kawai |
| 5,390,041 A | 2/1995 | Knecht et al. |

(Continued)

FOREIGN PATENT DOCUMENTS

| EP | 0311251 A2 | 4/1989 |
| WO | 2011/000257 A1 | 1/2011 |

OTHER PUBLICATIONS

Schuehler, D.V., "Techniques for Processing TCP/IP Flow Content in Network Switche at Giagbit Line Rates", Department of Computer Science and Engineering, Sever Institute of Technology, Washington University, Saint Louis, Missouri, Dec. 2004, 262 pages, http://citeseerx.ist.psu.edu/viewdoc/download?doi=10.1.1.331.1116&rep=rep1&type=pdf.

(Continued)

*Primary Examiner* — Kevin M Cunningham
(74) *Attorney, Agent, or Firm* — Chamberlain, Hrdlicka, White, Williams & Aughtry

(57) ABSTRACT

A system that receives a line encoded data stream from a source. The system has a de-serializer for de-serializing a line encoded data stream to generate a raw parallel data stream. The system has a serializer for serializing the raw parallel data stream. The system has a parallel data generator configured to generate another raw parallel data stream. The system has reconfigurable circuitry for communicating the (Continued)

raw parallel data stream to the serializer in a configuration and communicating the other parallel data stream in another configuration.

16 Claims, 5 Drawing Sheets

(51) Int. Cl.
    *H03M 5/12*           (2006.01)
    *H04L 7/027*         (2006.01)
    *H03M 5/02*           (2006.01)
    *H03M 5/00*           (2006.01)
    *H03M 13/19*         (2006.01)
    *H03M 7/14*           (2006.01)

(52) U.S. Cl.
    CPC .............. *H04L 7/027* (2013.01); *H04L 67/02* (2013.01); *H03M 5/00* (2013.01); *H03M 7/14* (2013.01); *H03M 13/19* (2013.01)

(56) References Cited

U.S. PATENT DOCUMENTS

| | | |
|---|---|---|
| 6,268,808 B1 | 7/2001 | Iryami et al. |
| 8,326,988 B2 | 12/2012 | Poelstra et al. |
| 2011/0142232 A1* | 6/2011 | Jeong .................... H04L 9/0662 380/42 |
| 2015/0019921 A1 | 1/2015 | Chen et al. |

OTHER PUBLICATIONS

Extended European Search Report issued in corresponding European Application No. 16834327.5, dated Mar. 15, 2019.
"Frame synchronization"; Wikipedia; Dec. 10, 2014; XP055562436; https://en.wikipedia.org/w/index.php?title=Frame synchronization&oldid=637511728.
"Syncword"; Wikipedia; Jul. 31, 2015; XP055562432; https://en.wikipedia.org/w/index.php?title=Syncword&oldid=673938073.

* cited by examiner

SYSTEM AND A METHOD FOR A LINE ENCODED DATA STREAM

The present application is a National Phase entry of PCT Application No. PCT/AU2016/050750, filed Aug. 12, 2016, which claims the benefit of Australian Provisional Patent Application No. 2015903229, filed Aug. 12, 2015, which are incorporated herein by reference.

TECHNICAL FIELD

The disclosure herein generally relates to a system and a method, and particularly but not exclusively to a system and a method for modifying a line encoded data stream.

BACKGROUND

Information may be carried in a computer network by a line encoded data stream. The information may be arranged into Ethernet packets transporting Ethernet frames. Each Ethernet frame is generally proceeded by a preamble and start frame delimiter, for example, which are generally both part of the Ethernet packet. The line encoded data stream may be transmitted along a network cable in the form of an optical fibre network cable or an electrical network cable ("copper network cable"), or wirelessly transmitted.

In some circumstances, it may be desirable to modify a line encoded data stream. An example of modifying a line encoded data stream is filtering the line encoded data stream.

Some technologies may simply not function unless communications latency is sufficiently small. In other applications, the latency of a communication may be, in some circumstances, an important factor in securing a favourable outcome. For example, being the first to have a complete electronic trade order received by a stock exchange may establish trade priority. Advantage can then be taken of favourable prices for financial instruments, examples of which include but are not limited to shares, derivatives and futures. Being the first to receive market information may enable a trader to take advantage of favourable market conditions before others. In another example, a favourable outcome for an individual playing a networked electronic game may be determinant on the latency of a gaming command received by a gaming system. Being able to send a low latency instruction to place a wager or a bid at an auction, for example, may increase the probability of securing good odds, a good price, or a successful purchase. Furthermore, it may be desirable, in at least some circumstances, to keep communications confidential.

SUMMARY

Disclosed herein is a system. The system comprises a deserialiser for de-serialising a line encoded data stream to generate a raw parallel data stream and a serialiser for serialising the raw parallel data stream. The system comprises a parallel data generator configured to generate another raw parallel data stream. The system comprises reconfigurable circuitry for communicating the raw parallel data stream to the serialiser in a configuration and communicating the other raw parallel data stream to the serialiser in another configuration. The system comprises a controller configured to confirm satisfaction of a trigger condition and subsequently trigger reconfiguration of the reconfigurable circuitry between the configuration and the other configuration. The parallel data generator is configured for the other raw parallel data stream to be synchronised to the raw parallel data stream.

In an embodiment, the parallel data generator is configured for the other raw parallel data stream to be synchronised to the raw parallel data stream at the serialiser.

In an embodiment, the system is for modifying a line encoded data stream.

The system may introduce a relatively small amount of delay by communicating the raw parallel data stream from the deserialiser to the serialiser. Payload decoding logic, for example packet decoding logic, may not be required in the raw parallel data stream's path within the system. Inline packet decoding logic generally introduces latency. Gearboxes, scrambling, descrambling, block alignment, clock domain crossing, rate-matching FIFOs buffers etc. can be avoided in favour of simply transmitting what is received. Synchronisation of the data stream and the line encoded data stream may prevent a communication error resulting from the reconfiguration of the reconfigurable circuitry.

In an embodiment, the controller is configured to confirm satisfaction of the trigger condition and subsequently trigger reconfiguration of the reconfigurable circuitry for communicating the other parallel data stream to the serialiser.

In an embodiment, the controller is configured to confirm that the raw parallel data stream satisfies the trigger condition and subsequently trigger reconfiguration of the reconfigurable circuitry for communicating the other raw parallel data to the serialiser.

In an embodiment, the controller is configured to retrieve information, for example a payload, from the raw parallel data stream and confirm that the information satisfies the trigger condition and subsequently trigger reconfiguration of the reconfigurable circuitry for communicating the other raw parallel data to the serialiser.

In an embodiment, the trigger condition comprises at least one of: the payload comprises an Ethernet frame; the payload comprises a broadcast packet; the payload comprises a multicast packet; the payload comprises an Internet protocol packet; the payload comprises a UDP packet; the payload comprises a TCP packet; the payload comprises a HTTP request; the payload comprises a HTTP response; the payload comprises a proscribed source address; the payload comprises a proscribed destination address; the payload comprises a proscribed MAC source address; the payload comprises a proscribed MAC destination address; the payload comprises a proscribed Internet Protocol (IP) source address; the payload comprises a proscribed IP destination address; the payload comprises a Peripheral Component Interconnect Express (PCIe) packet; and the payload comprises an Infiniband message.

In an embodiment, the controller is configured to confirm satisfaction of another trigger condition and subsequently trigger reconfiguration of the reconfigurable circuitry for communication of the raw parallel-data stream to the serialiser. The controller may be configures to trigger reconfiguration for filtering out a sequence of payloads terminated by the other payload.

In an embodiment, the controller is configured to detect the end of the payload and subsequently trigger reconfiguration of the reconfigurable circuitry for communicating the raw parallel-data stream to the serialiser.

In an embodiment, the controller is configured to detect one of an end-of-payload control code and an idle control code and subsequently trigger reconfiguration of the reconfiguration circuitry for communication of the raw parallel-data stream to the serialiser.

In an embodiment, in one of the configurations the reconfigurable circuitry is configured for communicating to the serialiser one of the raw parallel data stream and the other raw parallel data stream, and in the other configuration the reconfigurable circuitry is configured for communicating to the serialiser the other one of the raw parallel data stream and the other raw parallel data stream.

In an embodiment, in the configuration the reconfigurable circuitry has a raw parallel data stream path that connects the serialiser and deserialiser for communicating the raw parallel data stream to the serialiser, and in the other configuration the parallel data generator is in communication with the serialiser for communicating the other parallel data stream to the serialiser. The raw parallel data stream path may comprise a delay line. The delay line may comprise at least one register.

The confirmation by the controller may be made before the end of a payload is sent. If there are no privacy concerns, then the decision can simply be made by the end of receipt of the payload. If there are privacy concerns, then the decision may be made by the time the part of the payload that is sensitive is sent to the output. If the latency of the controller is relatively high, then the delay line may be necessary. Since a payload can be generally aborted right up until the end of the packet, this generally means that the latency of the controller is preferably, but not necessarily, less than the time taken for a packet to traverse the device.

In an embodiment, the raw parallel data stream path has a latency of less than at least one of: 1 clock cycle of the line encoded data stream; substantially the number of clock cycles of the line encoded data stream it takes to determine the trigger condition; substantially the number of clock cycles of the line encoded data stream in a payload; and the number of clock cycles of the line encoded data stream required to synchronise the other parallel data stream.

In an embodiment, the parallel data generator comprises a block aligner configured to give at least one block of the other raw parallel data stream the same block alignment as a plurality of blocks of the raw parallel data stream.

In an embodiment, the parallel data generator comprises a block scrambling synchroniser configured for synchronising the scrambling of the other raw parallel data stream and the raw parallel data stream. The block scrambling synchroniser may be configured for synchronising the scrambling of the other raw parallel data stream and the raw parallel data stream at the serialiser.

In an embodiment, the parallel data generator comprises a block generator configured to generate at least one block.

In an embodiment, the other raw parallel data stream is configured to cause a machine receiving the at least one block to reject a payload.

In an embodiment, the other raw parallel data stream is configured to erase or replace information in the payload.

An embodiment comprises at least one logic device having at least one of the serialiser, the deserialiser, the parallel data generator, the reconfigurable circuitry and the controller.

In an embodiment, the at least one logic device comprises at least one of a field programmable gate array (FPGA), an application specific integrated circuit (ASIC), and a complex programmable logic device (CPLD). The at least one logic device may comprise, for example, a plurality of field programmable arrays, a plurality of ASICs and a plurality of CPLDs.

In an embodiment, the parallel data generator is configured to be controlled by a clock recovered from the line encoded data stream by the deserialiser.

In an embodiment, the parallel data generator is configured to generate the other raw parallel data stream such that a protocol rule is not violated when the reconfigurable circuitry is reconfigured between the configuration and the other configuration.

Disclosed herein is a method. The method comprises the step of de-serialising a line encoded data stream to generate a raw parallel data stream. The method comprises the step of generating another raw parallel data stream. The method comprises the step of serialising one of the raw parallel data stream and other raw parallel data stream and transmitting the so serialised one of the raw parallel data stream and the other raw parallel data stream. The method comprises the step of confirming satisfaction of a trigger condition and subsequently cease serialising the one of the raw parallel data stream and the other raw parallel data stream and transmitting the so serialised one of the raw parallel data stream and the other raw parallel data stream, and commence serialising the other one of the raw parallel data stream and the other raw parallel data stream and transmitting the so serialised other one of the raw parallel data stream and the other raw parallel data stream. The other raw parallel data stream so serialised is synchronised to the raw parallel data stream so serialised.

In an embodiment, the method is for modifying a line encoded data stream.

An embodiment comprises the step of confirming satisfaction of the trigger condition and subsequently cease serialising and transmitting the raw parallel data stream and commence serialising and transmitting the other parallel data stream for transmission.

An embodiment comprises the step of retrieving information, for example a payload, from the raw parallel data stream and confirming that the information satisfies the trigger condition. The trigger condition may comprise at least one of: the payload comprises an Ethernet frame; the payload comprises a broadcast packet; the payload comprises a multicast packet; the payload comprises an Internet protocol packet; the payload comprises a UDP packet; the payload comprises a TCP packet; the payload comprises a HTTP request; the payload comprises a HTTP response; the payload comprises a proscribed source address; the payload comprises a proscribed destination address; the payload comprises a proscribed MAC source address; the payload comprises a proscribed MAC destination address; the payload comprises a proscribed Internet Protocol (IP) source address; the payload comprises a proscribed IP destination address; the payload comprises a Peripheral Component Interconnect Express (PCIe) packet; and the payload comprises an Infiniband message.

An embodiment comprises the step of confirming satisfaction of another trigger condition and subsequently cease serialising and transmitting the other raw parallel data stream and commence serialising and transmitting the raw parallel-data stream.

An embodiment comprises the step of detecting the end of the payload and subsequently cease serialising and transmitting the other raw parallel data stream and commence serialising and transmitting the raw parallel-data stream.

An embodiment comprises the step of detecting one of an end-of-payload control code and an idle control code and subsequently cease serialising and transmitting the other raw parallel data stream and commence serialising and transmitting the raw parallel-data stream.

An embodiment comprises the step of delaying the raw parallel data stream. The raw parallel data stream may be delayed with at least one register.

In an embodiment, the raw parallel data stream is delayed for a period selected from a group comprising: 1 clock cycle of the line encoded data stream; substantially the number of clock cycles of the line encoded data stream it takes to determine the trigger condition; substantially the number of clock cycles of the line encoded data stream in a payload; and the number of clock cycles of the line encoded data stream required to synchronise the other parallel data stream.

An embodiment comprises the step of generating a plurality of blocks of the other raw parallel data stream, the other plurality of blocks having the same block alignment as a plurality of blocks of the raw parallel data stream.

An embodiment comprises the step of synchronising the scrambling of the other raw parallel data stream and the raw parallel data stream. The scrambling of the other raw parallel data stream and the raw data stream may be synchronised at the serialiser.

An embodiment comprises generating the plurality of blocks of the other raw parallel data stream.

In an embodiment, the other raw parallel data stream is configured to cause a machine receiving the plurality of blocks to reject a payload. The other raw parallel data stream may be configured to cause a machine receiving the plurality of blocks to reject a sequence of payloads terminated by the payload.

In an embodiment, the other raw parallel data stream is configured to erase or replace information in the payload.

In an embodiment, at least one of the steps of serialising, de-serialising, generating and confirming is performed within at least one logic device. The at least one logic device may comprise at least one of a field programmable gate array (FPGA), an application specific integrated circuit (ASIC), and a complex programmable logic device (CPLD). The at least one logic device may comprise, for example, a plurality of field programmable arrays, a plurality of ASICs and a plurality of CPLDs.

In an embodiment, the other raw parallel data has the same clock as the line encoded data stream.

In an embodiment, the other raw parallel data stream is synchronised such that a protocol is not violated by commencing serialising and transmission of the other one of the raw parallel data stream and the other raw parallel data stream.

Disclosed herein is a system. The system comprises an input for receiving a line encoded data stream and an output for transmitting the line encoded data stream. The system comprises a data generator configured to generate another data stream. The system comprises reconfigurable circuitry configured to communicate the line encoded data stream to the output in a configuration and communicate the other data stream to the output in another configuration. The system comprises a controller configured to confirm satisfaction of a trigger condition and subsequently trigger reconfiguration of the reconfigurable circuitry between the configuration and the other configuration. The data generator is configured for the other data stream and the line encoded data stream to be synchronised.

In an embodiment, the data generator is configured for the other data stream and the line encoded data stream to be synchronised at the output. In an embodiment, the system is for modifying the line encoded data stream. Modifying the line encoded data stream may comprise, for example, at least one of filtering information in the line encoded data stream, and replacing at least one payload in the line encoded data stream with at least one other payload. The at least one other payload may not comprise useful information.

The system may introduce a relatively small amount of delay by communicating the line encoded data stream to the output. Payload decoding logic, for example packet decoding logic, may not be required in the line encoded data stream's path within the system. Inline packet decoding logic generally introduces latency. Gearboxes, scrambling, descrambling, block alignment, clock domain crossing, rate-matching first-in first-out (FIFIO) buffers etc. can be avoided in favour of simply transmitting what is received. Synchronisation of the data stream and the line encoded data stream may prevent a communication error resulting from the reconfiguration of the reconfigurable circuitry.

In an embodiment, the controller is configured to confirm satisfaction of the trigger condition and subsequently trigger reconfiguration of the reconfigurable circuitry from the configuration to the other configuration for communication of the other data stream to the output. This may be to filter the line encoded data stream or replace the line encoded data stream, for example. The controller may be configured to confirm that the line encoded data stream satisfies the trigger condition and subsequently trigger reconfiguration of the reconfigurable circuitry from the configuration to the other configuration for communication of the other data stream to the output. The controller may be configured to retrieve information, for example a payload, from the line encoded data stream and confirm that the information satisfies the trigger condition and subsequently trigger reconfiguration of the reconfigurable circuitry from the configuration to the other configuration for communication of the other data stream to the output. For example, if a payload having a particular address (e.g. IP or MAC address) is detected, then it may be blocked or filtered out. The trigger condition may comprise at least one of: the payload comprises an Ethernet frame; the payload comprises a broadcast packet; the payload comprises a multicast packet; the payload comprises an Internet protocol packet; the payload comprises a UDP packet; the payload comprises a TCP packet; the payload comprises a HTTP request; the payload comprises a HTTP response; the payload comprises a proscribed source address; the payload comprises a proscribed destination address; the payload comprises a proscribed MAC source address; the payload comprises a proscribed MAC destination address; the payload comprises a proscribed Internet Protocol (IP) source address; the payload comprises a proscribed IP destination address; the payload comprises a Peripheral Component Interconnect Express (PCIe) packet; and the payload comprises an Infiniband message.

In an embodiment, the controller is configured to confirm satisfaction of another trigger condition and subsequently trigger reconfiguration of the reconfigurable circuitry from the other configuration to the configuration for communication of the line encoded data stream to the output. The controller may be configured to confirm that the line encoded data stream satisfies the other trigger condition and subsequently trigger reconfiguration of the reconfigurable circuitry from the other configuration to the configuration for communication of the line encoded data stream to the output.

The controller may be configured to retrieve other information, for example another payload, from the line encoded data stream and confirm that the other information, for example another payload, satisfies the other trigger condition and subsequently trigger reconfiguration of the reconfigurable circuitry from the other configuration to the configuration for communication of the line encoded data stream to the output.

In an embodiment, the controller may be configured to detect the end of the payload and subsequently trigger the reconfiguration of the reconfigurable circuitry from the other configuration to the configuration for communication of the line encoded data stream to the output. The controller may be configured to trigger reconfiguration for filtering out a sequence of payloads terminated by the other payload.

In an embodiment, the controller is configured to detect one of an end-of-payload control code and an idle control code and subsequently trigger the reconfigurable circuitry to reconfigure for communication of the line encoded data stream to the output. The end-of-payload control code and/or the idle control code may be associated with the payload.

In an embodiment the reconfigurable circuitry may have a configuration in which a line encoded data stream path connects the input and the output for communicating the line encoded data stream to the output, and has another configuration in which the output is in communication with the data generator for communicating the other data stream to the output.

In an embodiment, the line encoded data stream path comprises a delay line. The delay line may comprise at least one of a capacitive delay, a plurality of logic gates, a time-of-flight delay comprising, for example, a wire or an optical communications mechanism, a printed circuit board trace, and/or a plurality of IODELAY elements in an FPGA. Generally, any suitable method to delay the signal may be used.

The controller may be configured to confirm that the trigger condition is satisfied before the end of a payload is sent. If there are no privacy concerns, then the decision may simply be made by the end of receipt of the payload. If there are privacy concerns, then the decision may be made before the part of the payload that is sensitive is sent to the output. If the latency of the controller is relatively high, then the delay line may be necessary. Since a payload may be generally aborted right up until the end of the packet, this generally means that the latency of the controller is preferably, but not necessarily, less than the time taken for a packet to traverse the device.

In an embodiment, the line encoded data stream path has a latency of less than at least one of: 1 clock cycle; substantially the number of clock cycles it takes to determine the trigger condition; substantially the number of clock cycles in a payload; and the number of clock cycles required to synchronise the other parallel data stream. A latency of less than 1 clock cycle may be used if the data generator does not require any prior knowledge of the data stream. A latency of less than substantially the number of clock cycles it takes to determine the trigger condition may be used if knowledge of the trigger condition is required before the first part of the encoded data stream is output. A latency of substantially the number of clock cycles in a payload may be used if knowledge of the entire payload is required before the trigger condition can be determined. A latency of the number of clock cycles required to synchronise the other parallel data stream may be used if some information is required from the data stream to synchronise the parallel data stream, or if some processing time is required to synchronise the parallel data stream.

In an embodiment, the data generator comprises a block generator. The block generator may be configured to generate at least one block for replacing at least one block of the line encoded data stream.

In an embodiment, the data generator comprises a block aligner configured to give the at least one block for replacing the at least one block of the line encoded data stream the same block alignment as a plurality of blocks of other data stream. Consequently, the block alignment of the line encoded data stream and the other data stream are synchronised.

An embodiment comprises a block scrambling synchroniser configured for synchronising the scrambling of the other data stream. The block scrambling synchroniser is configured for synchronising the scrambling of the other data stream and the line encoded data stream at the output.

In an embodiment, the other data stream is configured to cause a machine receiving a plurality of blocks of the other data stream to reject a payload. The rejected payload may be at least part of the payload of the line encoded data stream by the controller.

In an embodiment, the other data stream is arranged to replace or erase information in the payload. This may ensure, for example, that sensitive information is not transmitted. Alternatively, the other data stream comprises information in the line encoded data stream. This may provide, for example, integrity of a data connection between network nodes.

An embodiment comprises at least one logic device having at least one of the data generator and the controller. The at least one logic device may comprise at least one of a field programmable gate array (FPGA), an application specific integrated circuit (ASIC), and a complex programmable logic device (CPLD). The at least one logic device may comprise, for example, a plurality of field programmable arrays, a plurality of ASICs and a plurality of CPLDs.

An embodiment comprises a clock recovery system configured to recover a clock from the line encoded data stream and generate the other data stream using the clock. The data generator may comprise the clock recovery system configured to recover the clock from the line encoded data stream and generate the other data stream using the clock. In an embodiment, the reconfigurable circuitry comprises a switch. The reconfigurable circuitry may comprise a crosspoint switch.

In an embodiment, the data generator is configured to generate the other data stream such that a protocol rule is not violated when the reconfigurable circuitry is reconfigured between the configuration and the other configuration. The protocol rule may include a timing jitter rule, a clock tolerance rule, a block encoding format rule, a bit error rate rule, and a scrambling format rule.

Disclosed herein is a method. The method comprises receiving a line encoded data stream. The method comprises generating another data stream. The method comprises transmitting the line encoded data stream. The method comprises confirming satisfaction of a trigger condition and subsequently cease transmitting the line encoded data stream and commence transmitting the other data stream. The other data stream is synchronised to the line encoded data stream.

In an embodiment, the method is for modifying the line encoded data stream.

An embodiment comprises the step of confirming that the line encoded data stream satisfies the trigger condition and subsequently cease transmission of the line encoded data stream and commence transmission of the other data stream.

An embodiment comprised retrieving information, for example a payload, from the line encoded data stream and confirming that the information satisfies the trigger condition and subsequently cease transmission of the line encoded data stream and commence transmission of the other data stream.

In an embodiment, the trigger condition comprises at least one of: the payload comprises an Ethernet frame; the payload comprises a broadcast packet; the payload comprises a multicast packet; the payload comprises an Internet protocol packet; the payload comprises a UDP packet; the payload comprises a TCP packet; the payload comprises a HTTP request; the payload comprises a HTTP response; the payload comprises a proscribed source address; the payload comprises a proscribed destination address; the payload comprises a proscribed MAC source address; the payload comprises a proscribed MAC destination address; the payload comprises a proscribed Internet Protocol (IP) source address; the payload comprises a proscribed IP destination address; the payload comprises a Peripheral Component Interconnect Express (PCIe) packet; and the payload comprises an Infiniband message.

An embodiment comprises confirming satisfaction of another trigger condition and subsequently cease transmission of the other data stream and commence transmission of the line encoded data stream.

An embodiment comprises retrieving another payload from the line encoded data stream and confirming that the other payload satisfies another trigger condition and subsequently cease transmission of the other data stream and commence transmission of the line encoded data stream.

An embodiment comprises the step of detecting the end of the payload and subsequently triggering transmission of the line encoded data stream.

An embodiment comprises detecting one of an end-of-payload control code and an idle control code and subsequently transmitting the line encoded data stream.

An embodiment comprises the step of delaying the line encoded data stream.

An embodiment comprises the step of delaying the line encoded data stream with at least one of, for example, a capacitive delay, a plurality of logic gates, a time-of-flight delay comprising, for example, a wire or an optical communications mechanism, or a printed circuit board trace, a plurality of IODELAY elements in an FPGA. Generally, any suitable method to delay the signal by a consistent amount may be used.

In an embodiment, the line encoded data stream is delayed for no longer than a period selected from a group comprising: 1 clock cycle; substantially the number of clock cycles it takes to determine the trigger condition; substantially the number of clock cycles in a payload; and the number of clock cycles required to synchronise the other parallel data stream.

An embodiment comprises the step of generating a plurality of blocks of the other data stream, the plurality of blocks of the other data stream having the same block alignment as a plurality of blocks of the line encoded data stream.

An embodiment comprises the step of synchronising scrambling of the other data stream and the line encoded data stream.

In an embodiment, the other data stream is configured to cause a machine receiving the plurality of blocks of the other stream to reject a payload.

In an embodiment, the other data stream is configured to erase or replace information in the payload.

In an embodiment, at least one of generating the other data stream and confirming satisfaction of the trigger condition is performed within at least one logic device. The at least one logic device may comprise at least one of a field programmable gate array (FPGA), an application specific integrated circuit (ASIC), and a complex programmable logic device (CPLD). The at least one logic device may comprise, for example, a plurality of field programmable gate arrays, a plurality of ASICs and a plurality of CPLDs.

In an embodiment, the data stream has the same clock rate as the line encoded data stream.

In an embodiment, the other data stream is synchronised to the line encoded data stream such that a protocol rule is not violated when transmission of one of the line encoded data stream and the other data stream ceases and the transmission of the other one of the line encoded data stream and the other data stream commences. The protocol rule may include a timing jitter rule, a clock rule, a clock encoding format rule, a bit error rate rule, and a scrambling format rule.

An embodiment comprises the step of reconfiguring a crosspoint switch to cease transmitting the line encoded data stream and commence transmitting the other one of the line encoded data stream and the other data stream. The crosspoint switch may be implemented in an FPGA or may be implemented in a crosspoint switch package.

Any of the various features of each of the above disclosures, and of the various features of the embodiments described below, can be combined as suitable and desired.

BRIEF DESCRIPTION OF THE FIGURES

Embodiments will now be described by way of example only with reference to the accompanying figures in which.

DESCRIPTION OF EMBODIMENTS

Figure 1:
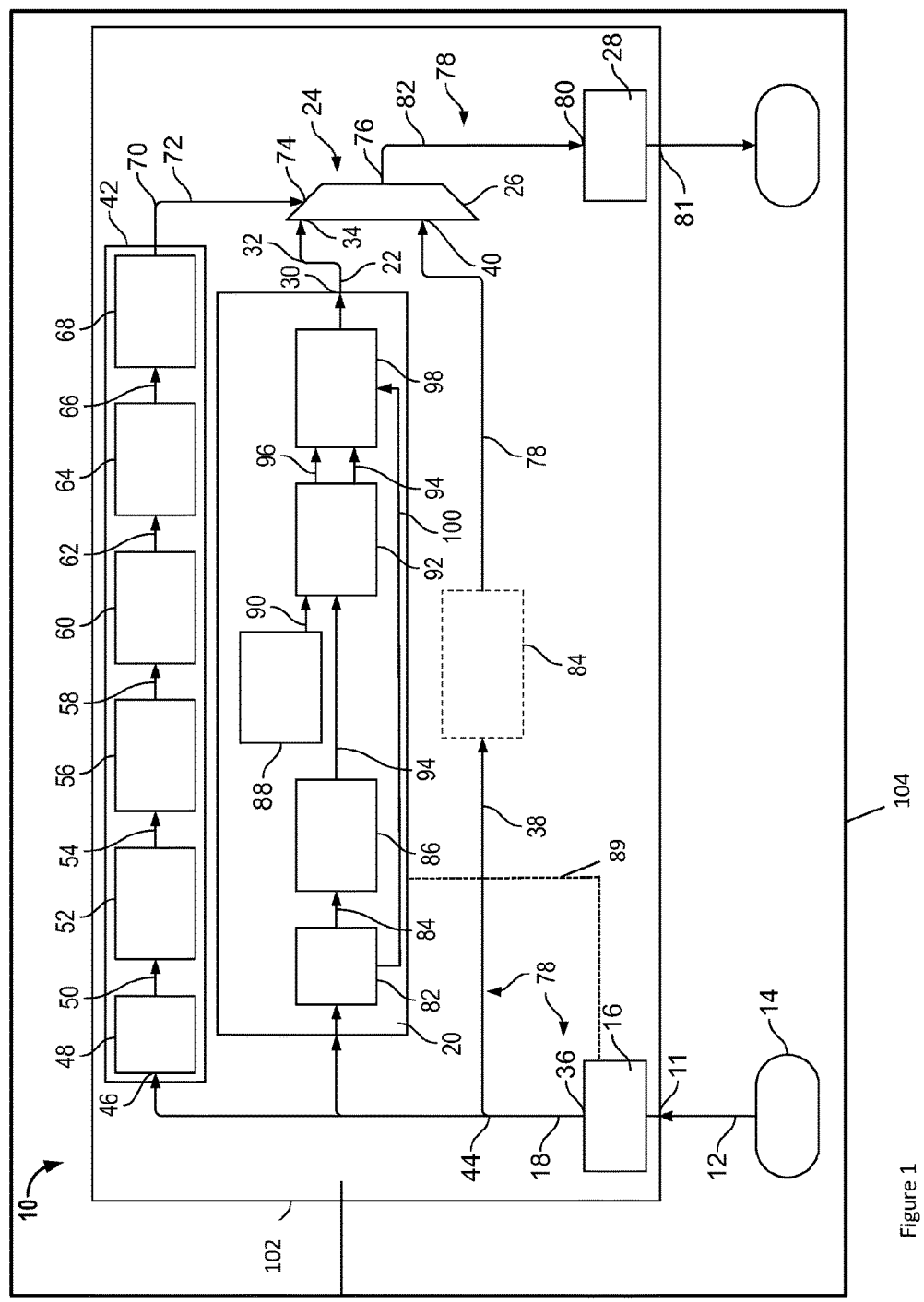
FIG. 1 shows an embodiment of a system.

FIG. 1 shows an embodiment of a system generally indicated by the numeral 10. The system 10 has an input 11 for receiving a line encoded data stream 12. The system has an output 81 for transmitting the line encoded data stream 12. The system 10 has a de-serialiser 16 for de-serialising the line encoded data stream 12 to generate a raw parallel data stream 18. The system 10 has a serialiser 28 for serialising the raw parallel data stream 18. The system 10 has a parallel data generator 20 configured to generate another raw parallel data stream 22. The system 10 has reconfigurable circuitry 24 for communicating raw parallel data stream 18 to the serialiser 28 in a configuration and communicating the other parallel data stream 22 in another configuration.

The system 10 is, in this but not necessarily in all embodiments, a system for modifying a line encoded data stream.

In system 10, but not all embodiments, the reconfigurable circuitry 24 is configured to communicate one of the raw parallel data stream 18 and the parallel data stream 22 to the serialiser 28 in the configuration and the other one of the raw parallel data stream 18 and the other parallel data stream 22 in the other configuration.

The system 10, but not all embodiments, comprise at least one logic device 102 in the form of at least one field programmable gate array (FPGA), for example a VIRTEX 7, ARRIA 10, ULTRASCALE etc. The embodiment of FIG. 1 comprises a single FPGA 102, however others may have more than one FPGA. In alternative embodiments, the logic device 102 may take the form of an application-specific integrated circuit (ASIC) or a complex programmable logic device (CPLD), or generally any suitable of logic device. In system 10, the serialiser 16, the reconfigurable circuitry 24, the deserialiser 28, the data generator 20, and the controller 42 are each integral to the logic device 102. In other embodiments, however, only some of the components are integral to the logic device, or may be in separate packages.

The input 11 is in the form of an input port 11 for receiving the line encoded data stream. The port 11 is configured for interfacing with a line encoded data stream conduit external of the logic device 102. In this particular embodiment, but not all, the port 11 is in the form of an electrically conductive pad that is solderable to a circuit board in the form of a printed circuit board 104. The port 11 may additionally or alternatively take the form of a pin. The line encoded data stream source 14 is in this but not necessarily all embodiments a part of the circuit board 104. The source 14 may be external of the circuit board 104 or device hosting the circuit board 104.

In an alternative embodiment, the system 10 is one of a plurality of systems 10 that are integral to logic device 102. The reconfigurable circuitry 24 comprises a switch 26 in the form of a cross point switch. The output 30 of the parallel data generator 20 is connected via a bus 32 to an input 34 of the reconfigurable circuitry 24.

An output 36 of the deserialiser 16 is connected via bus 38 to another input 40 of the reconfigurable circuitry 24.

The system 10 has a controller 42 configured to confirm satisfaction of a trigger condition and subsequently trigger reconfiguration of the reconfigurable circuitry 24. The controller 42 comprises a trigger circuit 68 configured to confirm satisfaction of the trigger condition and subsequently trigger reconfiguration of the reconfigurable circuitry 24. The parallel data generator 20 is configured for the other raw parallel data stream 22 to be synchronised to the raw parallel data stream 18. The other raw parallel data stream 22 may be synchronized to the raw parallel data stream 18 at the serialiser 28. That is, at least one of the following properties of the line encoded data stream 12 input to the serialiser 28 are preserved by reconfiguration of the reconfigurable circuitry: The block alignment, the block scrambling sequence, and the line encoded data stream clock.

In the embodiment of FIG. 1, the controller 42, but not in all embodiments, the trigger circuit 68, is configured to confirm satisfaction of the trigger condition and subsequently trigger the reconfigurable circuitry 24 to reconfigure for communicating the other parallel data stream 22 to the serialiser 28. For example, the controller 42 may be configured to confirm that the raw parallel data stream 18 satisfies the trigger condition and subsequently trigger the reconfigurable circuitry 24 to reconfigure for communicating the other raw parallel data 22 to the serialiser. A tap 44 communicates the raw parallel data stream 18 to an input 46 of the controller 42. The controller 42 interrogates the raw parallel data stream 18 received at input 46. In one specific example, the controller 42 is configured to retrieve information in the form of a payload, for example, from the raw parallel data stream 18 and confirm that the information satisfies the trigger condition. The raw parallel data stream 18 received at input 46 is communicated within the controller 42 via a conduit to a block synchronisation module 48 that determines the block offset of the raw parallel data stream 18 and generates a sequence of words 50 that each correspond to a respective block of the line encoded data stream. The sequence of words 50 is communicated via a conduit to a descrambling module 52 that descrambles the sequence of words. The descrambled sequence of words 54 are communicated via a conduit to a decoding module 56 in the form of a 64b66b decoding module which decodes the descrambled sequence of words 54. The decoded sequence 58 is communicated via a bus to a media access control (MAC) module 60. The media access control module 60 retrieves a payload 62 that is communicated via a bus to a payload parsing module 64 to extract information 66 from the payload 62. The information 66 is communicated via a bus to the trigger circuit 68 in the form of a filter logic module 68 which determines if the information satisfies the trigger condition. If the filter logic model 68 determines that the information does indeed satisfy the trigger condition then the controller 42 generates a trigger signal 70 that is communicated via trigger signal conduit 72 to the reconfigurable circuitry 24 and in particular input 74 of switch 26. The switch 26 receives the trigger signal 70, which causes the switch to reconfigure such that the output 76 of the switch 26 is placed in communication with the input 34 of the switch 26, input 34 being in communication with the output 30 of the parallel data generator 20. The trigger circuit 68 may not be triggered for only a filtering function.

The trigger condition could comprise any number of payload conditions, for example at least one of:
  The payload comprises an Ethernet frame;
  the payload comprises a broadcast packet;
  the payload comprises a multicast packet;
  the payload comprises an Internet protocol packet;
  the payload comprises a UDP packet;
  the payload comprises a TCP packet;
  the payload comprises a HTTP request;
  the payload comprises a HTTP response;
  the payload comprises a proscribed source address;
  the payload comprises a proscribed destination address;
  the payload comprises a proscribed MAC source address;
  the payload comprises a proscribed MAC destination address;
  the payload comprises a proscribed Internet Protocol (IP) source address;
  the payload comprises a proscribed IP destination address;
  the payload comprises a Peripheral Component Interconnect Express (PCIe) packet; and
  the payload comprises an Infiniband message.

The controller 42 is, and at least in this embodiment specifically the trigger circuit 68, configured to confirm satisfaction of another trigger condition and subsequently trigger the reconfigurable circuitry 24 to reconfigure for communication of the raw parallel data stream 18 to the serialiser 28. For example, the controller 42 or trigger circuit 68 may be configured to detect the end of the payload (or the another payload) and subsequently trigger the reconfigurable circuitry to reconfigure for communicating the raw parallel data stream to the serialiser 28. In this and/or another embodiment, the controller 42 or trigger circuit 68 is configured to detect one of an end-of-payload control code and an idle control code, and subsequently trigger the reconfiguration circuitry 24 to reconfigure the communication of the raw parallel data stream 18 to the serialiser 28. A sequence of payloads terminated by the payload may be filtered or replaced.

Within the signal generator 20, for example, a layer 1 and/or layer 2 encoding is generated which matches the signal required to validly abort a payload, for example a packet. This is generated in a format such that only a minimal amount of processing has to occur. As a payload arrives it is decoded and the upstream logic decides whether the packet will be delivered or not. If it will not be delivered, then the output is switched to an "abort" signal, which validly aborts the signal (for example, in 10 Gb Ethernet may insert an error symbol).

In the configuration in which the raw parallel data stream 18 is communicated to the serialiser 28, the reconfigurable circuitry 24 has a raw parallel data stream path 78 in the form of a bus that connects the output 36 of the deserialiser 16 and the input 80 of the serialiser 28, via the input 40 of switch 26, and the output 76 of switch 26. The raw parallel data stream path includes the switch 26. In the other configuration, however, the parallel data generator 20 is in communication with the serialiser 28 for communicating the other parallel data stream 22 to the serialiser 28. In the other configuration, the other raw parallel data stream 22 generated by the data generator 20 is communicated via bus 22 to input 34 of switch 26, through the switch 26 to the switch output 76, and then communicated along bus 82 to the input 80 of the serialiser 28.

In this but not all embodiments, the raw parallel data stream path 78 comprises a delay line 84 electrically disposed between the deserialiser 16 and the switch 26. The delay line comprises at least one register for temporally delaying the raw parallel data stream 18. The delay introduced by the delay line 84 may be such that the latency of the raw parallel data stream path 78 is substantially the number of clock cycles of the line encoded data stream 18 it takes to determine the trigger condition, substantially the number of clock cycles of the line encoded data stream in a payload of the raw parallel data stream 18, and the number of clock cycles in the line encoded data stream 18 required to synchronise the other parallel data stream 22. In embodiments without a delay line 84, the latency of the raw parallel data stream path may be no more than one clock cycle of the line encoded data stream 18.

A latency of less than 1 clock cycle may be used if the data generator does not require any prior knowledge of the data stream. A latency of less than substantially the number of clock cycles it takes to determine the trigger condition may be used if knowledge of the trigger condition is required before the first part of the encoded data stream is output. A latency of substantially the number of clock cycles in a payload may be used if knowledge of the entire payload is required before the trigger condition can be determined. A latency of the number of clock cycles required to synchronise the other parallel data stream may be used if some information is required from the data stream to synchronise the parallel data stream, or if some processing time is required to synchronise the parallel data stream.

The data generator 20 is configured for the other data stream 22 to be synchronised to the line encoded data stream 18 at the serialiser 28. That is, the synchronisation of the signal measured at the serialiser input 80 immediately after the reconfigurable circuitry is reconfigured is the same as that before the reconfigurable circuitry is reconfigured. The same synchronisation is observed at the output 76 of the switch and at the output 81 of the serialiser 28. The other raw parallel data stream 22 is configured such that a protocol is not violated when the reconfigurable circuitry is reconfigured between the configuration and the other configuration. The parallel data generator 20 has another block synchronisation module 82 that generates block synchronisation information indicative of the alignment of a plurality of blocks of the raw parallel data stream 18 and generates a sequence of words 84 communicated via a conduit to a scrambling synchronisation module 86. The scrambling synchronisation module generates scrambling information 94 indicative of the scrambling sequence of the plurality of blocks of the raw parallel data stream 18. The data generator 20 has a block generator 88 that generates at least one block 90 that, in this but not all embodiments, is to replace a block within the raw parallel data stream 18. The at least one block may be, for example, configured to cause a machine receiving the at least one block to reject a payload. In some applications it may be desirable to conceal information within the raw parallel data stream 18, in which case the at least one block when used to modify the raw parallel data stream 18 may erase information therein. The at least one block may replace blocks within the raw parallel data stream 18. The at least one block may be scrambled in a scrambling module 92. The scrambling synchronisation module 86 is in communication with the scrambling module 92 for communicating the scrambling information 94 via a conduit to the scrambling module 92. The scrambling module 92 uses the scrambling information 94 to synchronise the scrambling of the at least one block 90 to the raw parallel data stream 18 at the scrambler 92. The scrambled at least one block 96 is communicated from the scrambling module 92 to the block alignment module 98, which is in communication with the block synchronisation module 82 via a conduit and receives therefrom block synchronisation information 100. The block alignment module 98 gives the at least one block the same alignment as a plurality of blocks of the raw parallel data stream 18. The deserialiser 16 recovers from the line encoded data stream 12 a line encoded data stream clock. The system 10 has a clock conduit 89 for communicating the line encoded data stream clock from the deserialiser 16 to the parallel data stream generator 20 which is internally clocked by the line encoded data stream clock. Consequently, the parallel data generator 20 is controlled by the line encoded data stream clock.

The line encoded data stream in the embodiment of FIG. 1 is a 10G Ethernet line encoded data stream with a 64b/66b Ethernet block code structure defined by the standard IEEE 802.3. It will be appreciated however, that the line encoded data stream may be of any suitable protocols examples of which include but are not limited to 1G and 10G Ethernet, FireWire, InfiniBand, USB, PCIe, and FiberChannel. Some forms of block encoding, including 10G Ethernet and Hamming codes, include error detection and error correction. Other suitable protocols may have, for example, 8b/10b encoded blocks, 128b/132b encoded blocks, and 128b/132b encoded blocks.

The system may be inserted into a network in the form of, for example, a PAN, LAN, MAN, WAN or generally any suitable form of network.

Figure 4:
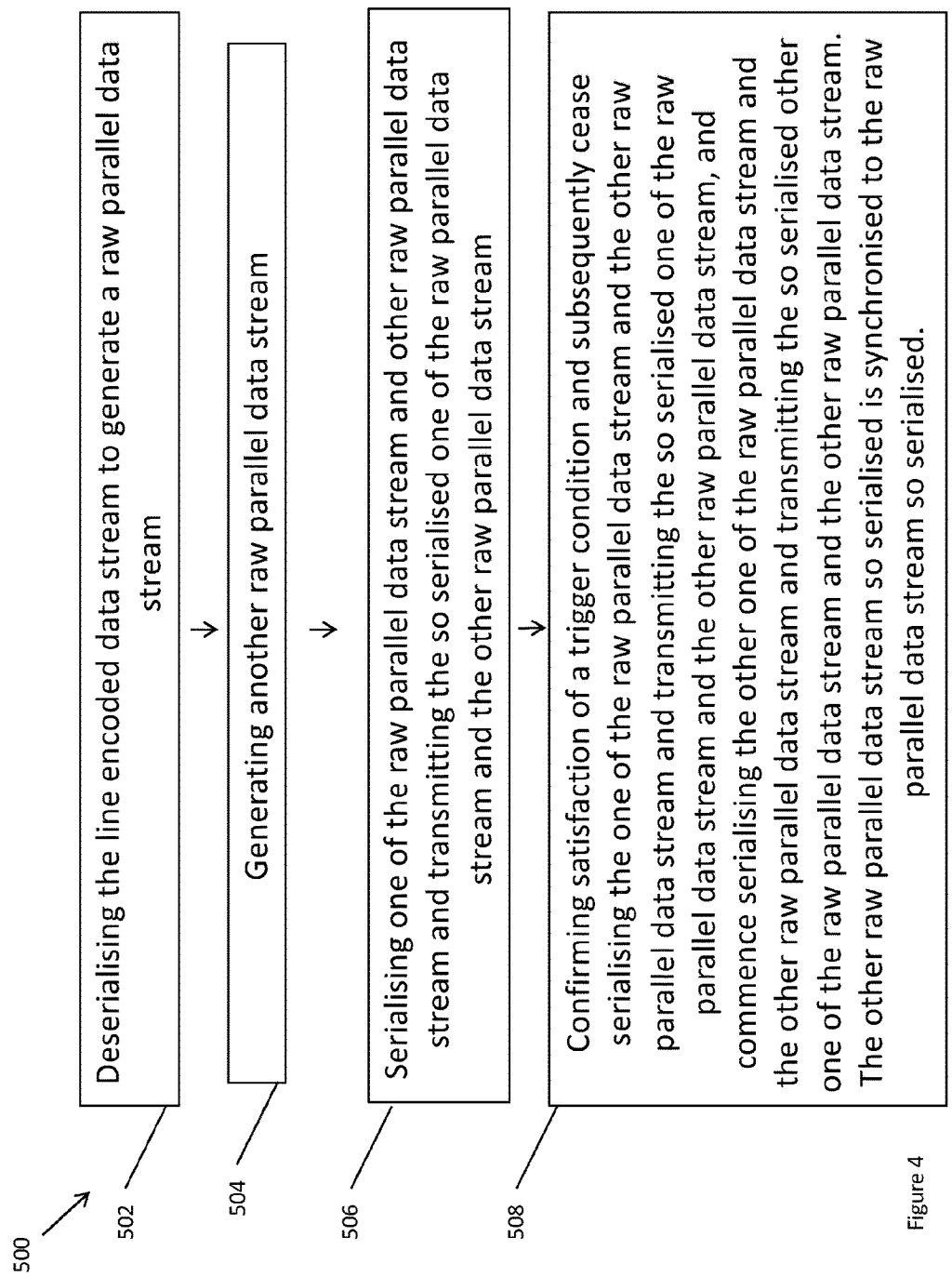
FIG. 4 discloses an embodiment of a method that may be performed using the system of FIG. 1.

FIG. 4 discloses an embodiment of a method 500 that may be performed using the system 10. The method comprises the step 502 of de-serialising a line encoded data stream to generate a raw parallel data stream. The method comprises the step 504 of generating another raw parallel data stream. The method comprises the step 506 of serialising one of the raw parallel data stream and other raw parallel data stream and transmitting the so serialised one of the raw parallel data stream and the other raw parallel data stream. The method comprises the step 508 of confirming satisfaction of a trigger condition and subsequently cease serialising the one of the raw parallel data stream and the other raw parallel data stream and transmitting the so serialised one of the raw parallel data stream and the other raw parallel data stream, and commence serialising the other one of the raw parallel data stream and the other raw parallel data stream and transmitting the so serialised other one of the raw parallel data stream and the other raw parallel data stream. The other raw parallel data stream so serialised is synchronised to the raw parallel data stream so serialised.

Figure 5:
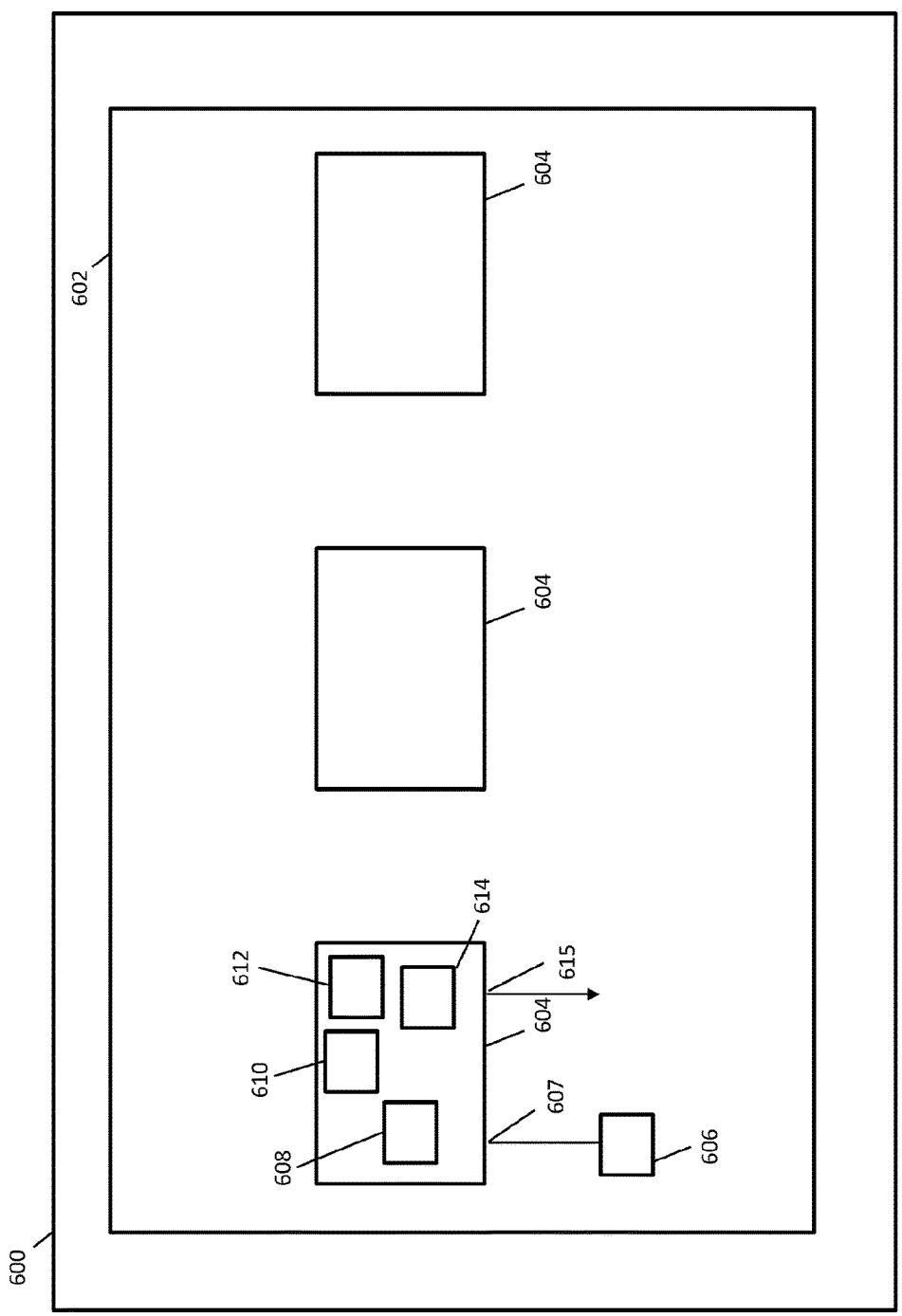
FIG. 5 shows another embodiment of a system.

FIG. 5 shows another embodiment of a system 600. The system 600 comprises at least one logic device 602 in the form of at least one field programmable gate array (FPGA), for example a VIRTEX 7, ARRIA 10, ULTRASCALE etc. System 600 comprises a single FPGA 602, however others may have more FPGAs. In alternative embodiments, the logic device 602 may take the form of an application-specific integrated circuit (ASIC) or a complex programmable logic device (CPLD), or generally any suitable form of logic device. The system 600 comprises a plurality of systems 604 that are each integral to the logic device 602. Each system 604 has a port 607 for receiving a line encoded data stream from a source 606. Each system 604 has a de-serialiser 608 for de-serialising the line encoded data stream 12 to generate a raw parallel data stream. Each system 604 has a serialiser 610 for serialising the raw parallel data stream. Each system 604 has a parallel data generator 612 configured to generate another raw parallel data stream. The system 10 has reconfigurable circuitry 614 for communicating raw parallel data stream to the serialiser 610 in a configuration and communicating the other parallel data stream in another configuration.

The systems 604 are generally of similar form and/or function as system 10, except where necessarily not in view of the differences between the architectures of systems 10, 604.

Some embodiments may broadcast the line encoded data stream to a plurality of outputs and filter the line encoded data stream at each of the plurality of outputs. Filtering the line encoded data stream by the present embodiments may introduce relatively little time delay, which is beneficial for applications that require low latency.

Figure 2:
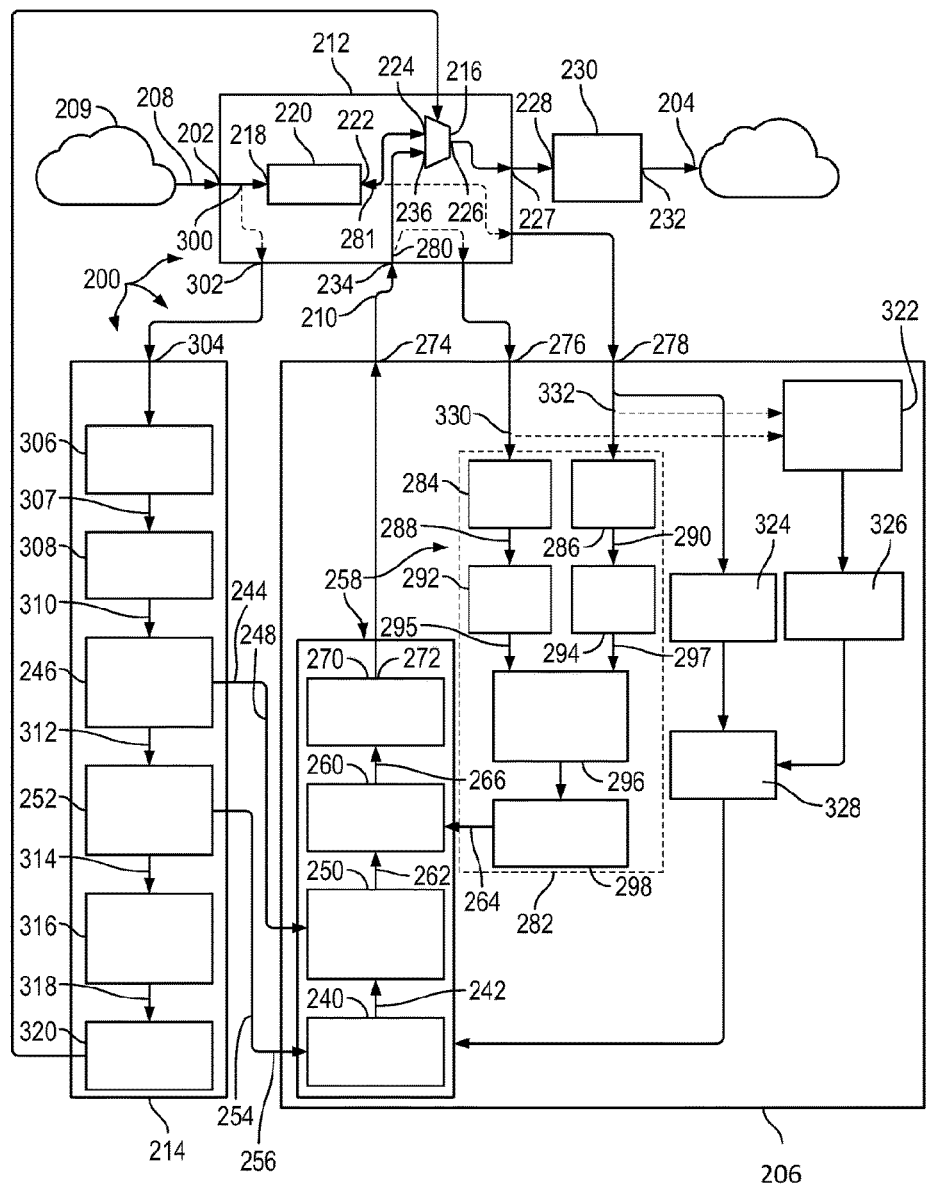
FIG. 2 shows another embodiment of a system.

FIG. 2 shows another embodiment of a system generally indicated by the numeral 200. The system 200 has an input 202 for receiving a line encoded data stream 208. The system 200 also has an output 204 for transmitting the line encoded data stream. The system has a data generator 206, which is configured to generate another data stream 210. The system 200 has reconfigurable circuitry 212 that in a configuration is configured to communicate the line encoded data stream 208 to the output 204. In another configuration, the reconfigurable circuitry 212 is configured to communicate the other data stream to the output 204. The system 200 has a controller 214 that is configured to confirm satisfaction of a trigger condition, and subsequently trigger reconfiguration of the reconfigurable circuitry 212 between the configuration and the other configuration. The data generator 206 is configured for the other data stream 210 and the line encoded data stream 208 to be sychronised, for example at the output 204. That is, the synchronisation of the signal measured at the output 204 immediately after the reconfigurable circuitry is reconfigured is the same as that before the reconfigurable circuitry is reconfigured. The same synchronisation may be observed at 232, 228, 227, and 236 for example.

At least one of following properties of the data stream at the output are preserved by reconfiguration of the reconfigurable circuitry because of the syncronisation of the other data stream 210 and the line encoded data stream 208: The block alignment, the block scrambling sequence, and the data stream input's clock. The other data stream 210 and the line encoded data stream 208 may be syncronised at the output.

The embodiment 200 is for modifying a line encoded data stream.

The controller 214 is configured to confirm satisfaction of the trigger condition and subsequently trigger the reconfigurable circuitry 212 to reconfigure for communication of the other data stream 210 to the output 204. In this embodiment, the controller 214 is configured to confirm that the line encoded data stream 208 satisfies the trigger condition and subsequently trigger the reconfigurable circuitry 206 to reconfigure communication of the other data stream to the output 204. The controller 214 is configured to retrieve information, for example a payload from the line encoded data stream 208. The controller is configured to confirm that the information satisfies the trigger condition and subsequently trigger the reconfigurable circuitry 212 to reconfigure for communication of the other data stream 210 to the output 204. The information may comprise a payload or the information may be from any layer of the Open Systems Interconnection Model (OSI model), and may comprise an Ethernet packet or other information.

The trigger condition may comprise any number of payload or other conditions, for example at least one of:
The payload comprises an Ethernet frame;
the payload comprises a broadcast packet;
the payload comprises a multicast packet;
the payload comprises an Internet protocol packet;
the payload comprises a UDP packet;
the payload comprises a TCP packet;
the payload comprises a HTTP request;
the payload comprises a HTTP response;
the payload comprises a proscribed source address;
the payload comprises a proscribed destination address;
the payload comprises a proscribed MAC source address;
the payload comprises a proscribed MAC destination address;
the payload comprises a proscribed Internet Protocol (IP) source address;
the payload comprises a proscribed IP destination address;
the payload comprises a Peripheral Component Interconnect Express (PCIe) packet; and
the payload comprises an Infiniband message.

The controller 214 is configured to confirm satisfaction of another trigger condition and subsequently trigger the reconfigurable circuitry 214 to reconfigure for communication of the line encoded data stream 208 to the output 204. For example, the controller 214 is in one embodiment configured to retrieve other information, for example another payload, from the line encoded data stream 208 and confirm that the other information satisfies another trigger condition and subsequently trigger the reconfigurable circuitry 212 to reconfigure for communication of the line encoded data stream 208 to the output 204. In another embodiment, the controller 214 is configured to detect the end of the payload and subsequently trigger the reconfigurable circuitry 214 to reconfigure for communication of the line encoded data stream 208 to the output 204. The controller is configured to detect at least one of an end-of-payload control code and an idle control code, either of which may signal the end of the payload, and subsequently trigger the reconfigurable circuitry 212 to reconfigure for communication of the line encoded data stream 208 to the output 204.

The reconfigurable circuitry 212 comprises a switch 216 that facilitates the reconfiguration of the reconfigurable circuitry 212. In the configuration, the switch 216 is configured such that a line encoded data stream path is established between input 202 and the output 204, via input 218 of optional delay line 220, the output 222 of optional delay line 220, input 224 of switch 216, output 226 of switch 216, the output of the reconfigurable circuitry 212, input 228 of optional clock and data recovery unit 230, and the output 232 of optional clock and optional recovery unit 230. Without the optional delay line 220 the input 202 is in communication with the input 224 of the switch 216. Without the optional clock and data recovery module 230, the output 227 of the reconfigurable circuitry 212 is in direct communication with the output 204. In the other configuration, the switch 216 is configured such that the output 204 is in communication with the data generator 206 for communicating the other data stream 210 to the output 204. Another data stream path is established between other input 234 of the reconfigurable circuitry 212, the other input 236 of the switch 216, the output 226 of the switch 216, the outputs 227 of the reconfigurable circuitry, the input 228 of the optional clock and data recovery unit 230, the output 232 of the optional clock and data recovery unit 230, and the output 204. Without the optional clock and data recovery unit 230, the output 227 of the reconfigurable circuitry 212 is in direct communication with the output 204.

In this embodiment, the system 200 has the delay line 220 electrically disposed between the input 202 of the reconfigurable circuitry 212 and the input 224 of the switch 216. The delay line 220 comprises at least one of a capacitive delay, a plurality of logic gates, a time-of-flight delay comprising for example a copper trace or optical communications mechanism, or a printed circuit board trace, and a plurality of IODELAY elements in an FPGA. Generally, any suitable method to delay the signal by a consistent amount may be used.

The line encoded data stream path through switch 216 may have a latency of less than at least one of one clock cycle, substantially the number of clock cycles it takes to determine the trigger condition, substantially the number of clock cycles in a payload, and the number of clock cycles required to synchronise the other parallel data stream.

The data generator 206 has a block generator 240. The block generator 240 is configured to generate blocks that are to replace blocks within the line encoded data stream 208. The blocks 242 may be synchronised to the line encoded data stream at the output 204. The blocks 242 generated by the block generator 240 are to be synchronised to the line encoded data stream 208 at the output 204. Scrambling information 244 generated by a descrambling module 246 ("scramble sync and descramble") of the controller 214 is communicated via conduit 248 to a scrambling module 250 (scramble, 64/66 encode, MAC, etc.) of the data generator 206. The scrambling module 250 receives the blocks 242 via a conduit and synchronises the scrambling of the blocks 242 generated by the block generator 240 with the blocks of the line encoded data stream 208 at the output 204. The block generator 240 receives via conduit 256 protocol synchronisation and MAC information 254 from a protocol synchroniser and MAC module 252. The block generator 240 uses the protocol sync and MAC information 254 to emit blocks 242 which, when passed through the other encoding stages, will form a line encoded data stream which is protocol compliant with the line encoded data stream 281. The data generator 206 has block alignment circuitry 258, which comprises a block aligner 260. The block aligner 260 receives from the scrambling module 250 the scrambled blocks 262 via a conduit. The block aligner 260 receives via a conduit block offset information 264 generated by the block alignment circuitry 258. The block offset information is indicative of the block offset of the other data stream 210 relative to the line encoded data stream. The block aligner 260 of the block alignment circuitry 258 generates using the block offset information 264 a sequence of words 266 that each correspond to a respective block of the line encoded data stream 208. The sequence of words 266 are communicated via a conduit from the block aligner 260 to a serialiser 270. The output 272 of the serialiser 270 is in communication with the output 274 of the data generator 206 which is in turn in communication with the input 234 of the reconfigurable circuitry 212.

The block alignment circuitry 258 has a first input 276 and a second input 278. The first input 276 receives the data stream 210 via tap 280 in the reconfigurable circuitry 212, which comprises a crosspoint switch. The second input 278 receives the line encoded data stream 208 in the reconfigurable circuitry 212. The block alignment circuitry 258 compares the data stream 210 and line encoded data stream 208 to generate the block offset information 264. Comparator 282 performs the comparison. The comparator 282 deserialises the data stream 210 and the line encoded data stream 208 in respective deserialisers 284 and 286. The outputs 288 and 290 of the deserialisers 284, 286 are received by block synchronisation modules 292 and 294 that determine the alignment of the blocks of the data stream 210 and the line encoded data stream 208. The output from the block synchronisation modules 292, 294, being block alignment information 295, 297 is received by an offset difference adjustment module 296 which generates offset adjustment information that is communicated via a conduit to integration unit 298 in the form of a proportional-integral-derivative controller, for example an I-type controller, that generates the block offset information 264 communicated to the block aligner 260. A phase offset detector 322 determines the phase offset between the signals input at input 276 and input 278 via taps 330 and 332. An integrator 326 in receives phase offset information from the phase offset controller 326 and sends integrator information to a phase aligner 328. The phase aligner sends phase alignment information to the signal generator 240. A clock recovery unit 324 receives a copy of the line encoded data stream at input 278 to recover a clock from the line encoded data stream 208. A recovered clock signal is sent by the cloak recovery unit 324 to the phase aligner.

The line encoded data stream 208 is communicated to the controller 214. A tap 300 within the reconfigurable circuitry 212 communicates the line encoded data stream 208 to an output 302 of the reconfigurable circuitry 212 in communication with input 304 of the controller 214. The controller 214 then interrogates the line encoded data stream 208 received at 304. The line encoded data stream 208 received at input 304 is communicated via a conduit within the controller 214 to a deserialiser 306, the output 307 of which is communicated to a block synchronisation module 308 that determines the block offset of the line encoded data stream 208 and generates a sequence of words 310 that each correspond to a respective block of the line encoded data stream 308. The sequence of words 310 are communicated to a module 246 that has a 64b64b decoding module that descrambles the sequence of words. The descrambled sequence of words 312 is communicated via a conduit to the protocol synchronisation and MAC module 252 to retrieve the payload from the descrambled sequence of words 312. The payload 314 is communicated via a conduit to a trigger circuit in the form of a filter logic module 316, which determines if the information in the payload satisfies the trigger condition. If the filter logic module 316 determines that the information does indeed satisfied the trigger condition, then a trigger signal 318 generated by the filter decision logic causes the reconfigurable circuitry 212 to reconfigure.

The trigger signal 318 is communicated via a conduit to a switch controller 320 that reconfigures the reconfigurable circuitry, and in particular the switch 216. The trigger circuit 68 may not be triggered for only a filtering function.

Figure 3:
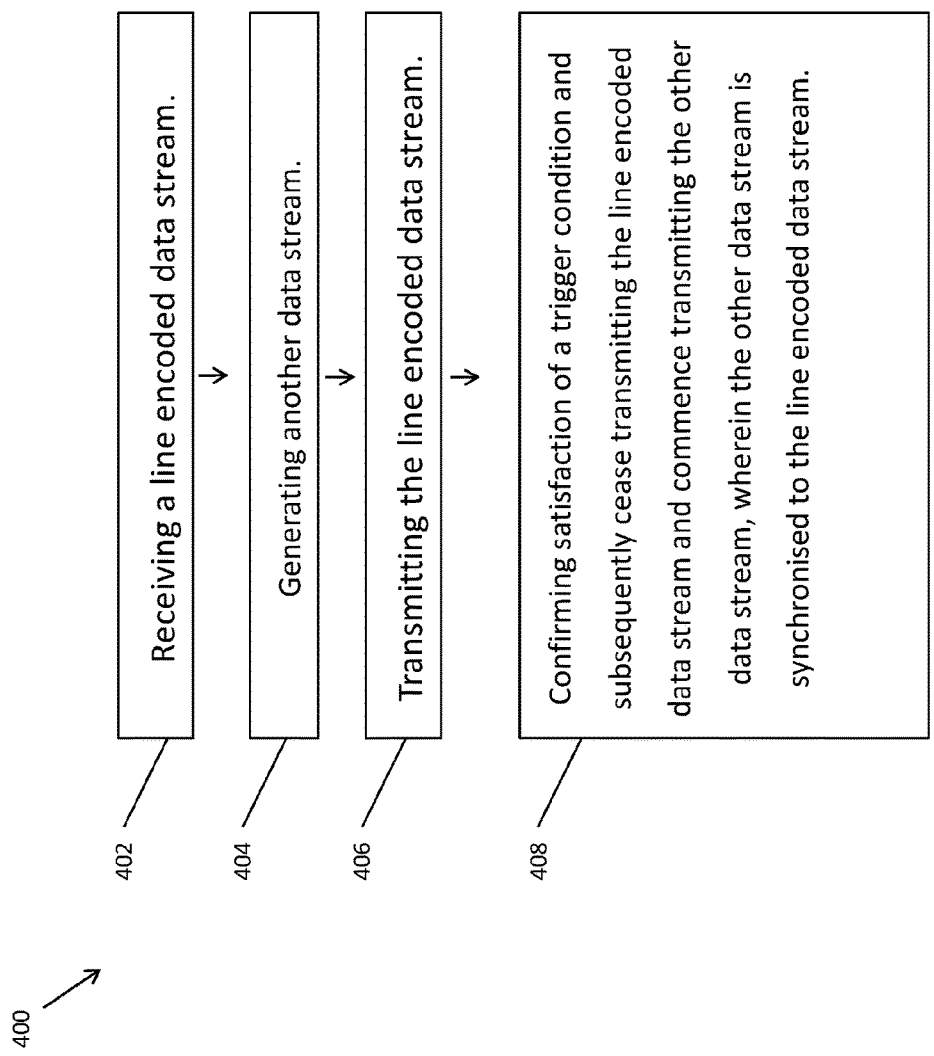
FIG. 3 discloses an embodiment of a method that may be performed using the system of FIG. 2.

FIG. 3 discloses an embodiment of a method 400 that may be performed using the system 200. The method comprises a step 402 of receiving a line encoded data stream. The method comprises a step 404 of generating another data stream. The method comprises a step 406 of transmitting the line encoded data stream. The method comprises a step 408 of confirming satisfaction of a trigger condition and subsequently cease transmitting the line encoded data stream and commence transmitting the other data stream. The other data stream is synchronised to the line encoded data stream.

All of the modifications to the line encoded data stream described with respect to the line encoded data stream processed with an embodiment of a system and/or an embodiment of a method described herein may, as suitable and desired, be performed by any other embodiment of a system and/or an embodiment of a method described herein.

Embodiments of the above described system and methods comply with a 10G Ethernet protocol, and other embodiments of the above described systems and methods comply with a 1G Ethernet protocol.

Encoding for the 10G Ethernet protocol includes:
1. Block synchronisation and alignment. For example, when you put 66 bits on the line, it must align with the block boundaries already on the line.
2. Scrambling in 10G Ethernet is based on previously received data, so if you're going to put different data on the line it needs to be encoded using information from the last data received.
3. Data synchronisation. The data contained within the blocks needs to 'make sense' given the previously received/transmitted blocks.

Encoding for the 1G Ethernet protocol includes:
1. Block synchronisation and alignment (which is 8b10b for the 1G Ethernet protocol).
2. Running disparity synchronisation. The DC bias of the outgoing signal may be different to the incoming signal, and so an appropriate DC bias may be created to switch between the line encoded data stream and the other data stream.
3. Data syncronisation. The data contained within the blocks needs to 'make sense' given the previously received/transmitted blocks.

In some other circumstances it may be desirable to switch from one source of data to another source of data. For example, when the source of data may have a lower latency than the other source of data, but is also less reliable. Switching from the one source of data to the other source of data when the source of data is interrupted may, however, cause a communications error, which may not be desirable.

In another embodiment, the source may be an external low latency transmission path over which the line encoded data stream is transmitted. A low latency transmission path may be for trading financial instruments, for example; a plurality of financial instrument trading orders received by a financial market may be processed in the order that they were received. In one example, the low latency transmission path comprises a microwave transmission path. The microwave transmission path, however, may be relatively unreliable because, for example, of the possibility of an inadvertent break of the microwave transmission path by an intersecting object. The data generator 20, 206 may also receive the line encoded data stream via another transmission path that is more reliable but has more latency than the low latency link. For example, the other transmission path may be a wired link. The controller may be configured to detect a break in the low latency transmission path and trigger the reconfigurable circuitry 24, 212 to reconfigure to the configuration in which the output of the data generator is transmitted from the output 204, 81 of the system 10, 200. The controller 42, 214 may be configured to detect the re-establishment of the low latency transmission path and subsequently trigger the reconfigurable circuitry 24, 212 to reconfigure to the other configuration in which the line encoded data stream is transmitted from the output of the system 10, 200.

It will be appreciated that the systems 10, 200 may be, for example, configured to be a firewall. Filtering may be based on, for example, MAC address, IP address, VLAN tag, port number, packet type etc.

The trigger condition for systems 10, 200 may comprise a plurality of conditions. For example, the trigger condition may be that a payload has a proscribed source address AND a proscribed destination address. The trigger condition may by any suitable Boolean expression, for example, including any one of, for example, of a MAC address, and IP address, a VLAN tag, a port number, a packet type etc. The trigger condition may comprise a condition requiring information external of the payload, for example the contents of memory set by software.

The systems 10, 200 may comprise or be integral to a multilayer printed circuit board (e.g. 104) having components mounted thereto which generally, but not necessarily, are connected to each other by conduits in the form of conductive pathways, which may comprise, for example, tracks, signal traces, strip lines and/or micro strip lines, and wires, as appropriate. Generally, but not necessarily, the printed circuit board is housed by a rack mountable enclosure having dimensions of 1 rack unit, although any suitable enclosure may be used or not used as desired. The printed circuit board has various surface mounted and/or through hole components mounted thereto. A mains supply may be mounted to the printed circuit board, the main supply in use producing a relatively low voltage, such as 12, 24 or 48 volts as suitable, from a relatively high voltage source, for example, a 110V or 240V electricity grid. There may be a DC regulator in the form of a switched mode power supply module mounted to the printed circuit board that receives the low voltage output from the mains supply and powers two or more active conductive rails integral to the circuit board. Alternatively, the mains supply and DC regulator may be mounted within the enclosure separate from the printed circuit board.

At least one fan may be mounted to the circuit board or alternatively the enclosure. The at least one fan may provide airflow across the multilayer printed circuit board to extract waste heat.

Associated or integrated with the circuit board may optionally be a receiver in the form of a line encoded data stream receiver, which may comprise an optical-to-electrical (o/e) converter. Associated or integrated with the circuit board may optionally be, for example a transmitter in the form of a data stream transmitter, which may comprise an electrical-to-optical (o/e) converter. In alternative embodiments described further below, the receiver and transmitter provide an electrical-to-electrical interface, for example supporting BASE-T Ethernet or direct attach electrical network cables. In this embodiment, but not necessarily in all embodiments, the receiver and transmitter are each configured to accept a network cable in the form of an optical network cable for interfacing with a network in the form of, for example, a local area network (LAN). The receivers and transmitters may be part of an enhanced small form factor pluggable (SFP+) transceiver. Generally, however, any suitable transceiver may be used, for example any of gigabit interface converter (GBIC), small form factor pluggable (SFP), 10 gigabit small form factor pluggable (XFP), 10 Gigabit Media Independent Interface (XAUI), C form-factor pluggable (CFP), quad small form-factor pluggable (QSFP), CXP specified by the Infiniband Trade Association, and a Thunderbolt transceiver. The o/e and e/o converters may alternatively be configured to receive an electrical network cable in the form of, for example, an electrical network cable, for example a copper network cable. Alternatively, the source may be from within the logic device, for example the FPGA.

The o/e and e/o converters may be housed in enclosures in the form of SFP cages fixed to the printed circuit board. The cages provide an electrical connection between electrical contacts on the transceivers and the conductive tracks. The cages may also act as Faraday cages to reduce electromagnetic interference, and extract heat from the transceiver. In alternative embodiments, the transceivers may be mounted directly to the printed circuit board.

The FPGA described herein (including but not limited to FPGA 102) may have any suitable architecture. In one embodiment, the FPGA architecture comprises an array of configurable logic blocks, I/O leads or pins, and routing channels. Generally, but not necessarily, the logic blocks comprise of logical cells that may comprise of, for example, a look up table, a full adder, and a D-type flip flop. Clock signals may be routed through special purpose dedicated clock networks within the FPGA in communication with a CDR module. The FPGA 24 may also include higher-level functionality including embedded multipliers, generic digital signal processing blocks, embedded processors, high-speed I/O logic for communication with components external of the FPGA (for example), and embedded memories that may be used by buffers.

The internal structure of the FPGAs described herein (including but not limited to FPGA 102) is configured to form a plurality of modules. The modules are initially specified, for example, using a hardware description language, examples of which include VHDL and VERILOG. The functionality to be implemented on the FPGA is described in a hardware description language. The description is compiled, synthesized and mapped to the FPGA using appropriate EDA tools to a configuration file that, when loaded or programmed into the FPGA, causes the FPGA to implement the functionality described.

Now that embodiments have been described, it will be appreciated that some embodiments may have some of the following advantages:

Modification of a line encoded data stream, for example filtering, may be performed with relatively low latency, which may be advantageous for trading applications, for example.

Packet decoding logic may not be required in the line encoded data stream's path within the system, which would introduce latency.

Reconfiguring the reconfigurable circuitry may not cause a protocol error.

Variations and/or modifications may be made to the embodiments described without departing from the spirit or ambit of the invention. The present embodiments are, therefore, to be considered in all respects as illustrative and not restrictive.

Prior art, if any, described herein is not to be taken as an admission that the prior art forms part of the common general knowledge in any jurisdiction.

In the claims which follow and in the preceding description of the invention, except where the context requires otherwise due to express language or necessary implication, the word "comprise" or variations such as "comprises" or "comprising" is used in an inclusive sense, that is to specify the presence of the stated features but not to preclude the presence or addition of further features in various embodiments of the invention.

The invention claimed is:

1. A system comprising:
an input configured to receive a line encoded data stream;
an output configured to transmit the line encoded data stream or an other data stream;
a data generator comprising first circuitry and configured to:
  receive the line encoded data stream from the input;
  generate the other data stream based on the line encoded data stream; and
  synchronize the other data stream with the line encoded data stream based on a set of characteristics of the line encoded data stream;
reconfigurable circuitry operatively connected to the input, the data generator, and a controller and configured to:
  communicate the line encoded data stream to the output in a first configuration; and
  communicate the other data stream to the output in a second configuration; and
the controller comprising second circuitry and configured to:
  receive the line encoded data stream from the input;
  make a determination, using the line encoded data stream, that a trigger condition is satisfied; and
  trigger, based on the determination, reconfiguration of the reconfigurable circuitry from the first configuration to the second configuration.

2. The system of claim 1, wherein the data generator is configured for the other data stream and the line encoded data stream to be synchronized at the output.

3. The system of claim 1, wherein the system is configured to modify the line encoded data stream.

4. The system of claim 1 wherein the controller is configured to retrieve a payload from the line encoded data stream and confirm that the payload satisfies the trigger condition and subsequently trigger reconfiguration of the reconfigurable circuitry from the first configuration to the second configuration for communication of the other data stream to the output.

5. The system of claim 4 wherein the trigger condition comprises at least one of: the payload comprises an Ethernet frame; the payload comprises a broadcast packet; the payload comprises a multicast packet; the payload comprises an Internet Protocol (IP) packet; the payload comprises a User Datagram Protocol (UDP) packet; the payload comprises a Transmission Control Protocol (TCP) packet; the payload comprises a Hypertext Transfer Protocol (HTTP) request; the payload comprises a HTTP response; the payload comprises a proscribed source address; the payload comprises a proscribed destination address; the payload comprises a proscribed Media Access Control (MAC) source address; the payload comprises a proscribed MAC destination address; the payload comprises a proscribed IP source address; the payload comprises a proscribed IP destination address; the payload comprises a Peripheral Component Interconnect Express (PCIe) packet; and the payload comprises an Infiniband message.

6. The system of claim 1, wherein the controller is further configured to confirm satisfaction of an other trigger condition and subsequently trigger reconfiguration of the reconfigurable circuitry from the second configuration to the first configuration for communication of the line encoded data stream to the output.

7. The system of claim 4, wherein the controller is configured to retrieve another payload from the line encoded data stream and confirm that the other payload satisfies an other trigger condition and subsequently trigger reconfiguration of the reconfigurable circuitry from the other configuration to the configuration for communication of the line encoded data stream to the output.

8. The system of claim 1, wherein the data generator further comprises a block generator configured to generate replacement block for replacing at least one block of the line encoded data stream.

9. The system of claim 8, wherein the data generator further comprises a block aligner configured to give the replacement block for replacing the at least one block of the line encoded data stream the same block alignment as a plurality of blocks of the other data stream.

10. The system of claim 1, further comprising a block scrambling synchronizer configured for synchronizing the scrambling of the other data stream.

11. The system of claim 1, wherein the other data stream is configured to cause a machine receiving a plurality of blocks of the other data stream to reject a payload, wherein the rejected payload is at least part of a payload of the line encoded data stream.

12. The system of claim 1, wherein the other data stream is arranged to replace or erase information in a payload.

13. The system of claim 1, further comprising at least one logic device comprising at least one of the data generator and the controller.

14. The system of claim 13, wherein the at least one logic device further comprises at least one of a field programmable gate array (FPGA), an application specific integrated circuit (ASIC), and a complex programmable logic device (CPLD).

15. The system of claim 1, further comprising a clock recovery system configured to recover a clock from the line encoded data stream and generate the other data stream using the clock.

16. The system of claim 1, wherein the data generator is further configured to generate the other data stream such that a protocol rule is not violated when the reconfigurable circuitry is reconfigured between the first configuration and the second configuration.

* * * * *

UNITED STATES PATENT AND TRADEMARK OFFICE
CERTIFICATE OF CORRECTION

PATENT NO. : 10,491,722 B2  
APPLICATION NO. : 15/752190  
DATED : November 26, 2019  
INVENTOR(S) : David Charles Ambler Snowdon Page 1 of 1

It is certified that error appears in the above-identified patent and that said Letters Patent is hereby corrected as shown below:

In the Claims

Column 23, Line 10, in Claim 7, the phrase "configured to retrieve another payload from" should read -- configured to retrieve an other payload from --.

Signed and Sealed this
Eleventh Day of February, 2020

Andrei Iancu
*Director of the United States Patent and Trademark Office*